(12) United States Patent
Kubota

(10) Patent No.: US 11,205,561 B2
(45) Date of Patent: Dec. 21, 2021

(54) PLASMA PROCESSING APPARATUS

(71) Applicant: Tokyo Electron Limited, Tokyo (JP)

(72) Inventor: Shinji Kubota, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/891,886

(22) Filed: Jun. 3, 2020

(65) Prior Publication Data

US 2020/0294770 A1    Sep. 17, 2020

Related U.S. Application Data

(63) Continuation of application No. 16/752,376, filed on Jan. 24, 2020, now Pat. No. 10,707,054.

(30) Foreign Application Priority Data

Feb. 5, 2019  (JP) ............................. JP2019-018833
Dec. 26, 2019  (JP) ............................. JP2019-236679

(51) Int. Cl.
*H01J 37/32*    (2006.01)
*H05H 1/46*    (2006.01)

(52) U.S. Cl.
CPC .. *H01J 37/32165* (2013.01); *H01J 37/32091* (2013.01); *H01J 37/32174* (2013.01); *H05H 1/46* (2013.01); *H05H 2242/20* (2021.05)

(58) Field of Classification Search
CPC .......... H01J 37/32082; H01J 37/32091; H01J 37/32165; H01J 37/32174; H01J 37/32183

(Continued)

(56) References Cited

U.S. PATENT DOCUMENTS 6,344,419 B1 *  2/2002  Forster .................. C23C 14/046
                                                          118/696
2005/0103623 A1 *  5/2005  Tolmachev ........... C23C 14/358
                                                          204/298.06

(Continued)

FOREIGN PATENT DOCUMENTS

JP    2000-012285 A    1/2000
JP    2000-173993 A    6/2000

(Continued)

OTHER PUBLICATIONS

Kushner et al.; "Ion Energy and Angular Distributions Into Small Features in Plasma Etching Reactors: The Wafer-Focus Ring Gap"; AVS 54th International Symposium; Oct. 2007; total 20 pages; USA.

(Continued)

*Primary Examiner* — Tung X Le
(74) *Attorney, Agent, or Firm* — Studebaker & Brackett PC

(57) ABSTRACT

In a plasma processing apparatus of an exemplary embodiment, a radio frequency power source generates radio frequency power for plasma generation. A bias power source periodically applies a pulsed negative direct-current voltage to a lower electrode to draw ions into a substrate support. The radio frequency power source supplies the radio frequency power as one or more pulses in a period in which the pulsed negative direct-current voltage is not applied to the lower electrode. The radio frequency power source stops supply of the radio frequency power in a period in which the pulsed negative direct-current voltage is applied to the lower electrode. Each of the one or more pulses has a power level that gradually increases from a point in time of start thereof to a point in time when a peak thereof appears.

20 Claims, 11 Drawing Sheets

(58) Field of Classification Search
USPC .................................................. 315/111.21
See application file for complete search history.

(56) References Cited

U.S. PATENT DOCUMENTS

| | | | |
|---|---|---|---|
| 2009/0078678 A1* | 3/2009 | Kojima | H01J 37/32165 216/71 |
| 2009/0255800 A1* | 10/2009 | Koshimizu | H01J 37/32165 204/164 |
| 2009/0295295 A1 | 12/2009 | Shannon et al. | |
| 2014/0262755 A1 | 9/2014 | Deshmukh et al. | |
| 2016/0056017 A1* | 2/2016 | Kim | H01J 37/321 156/345.28 |
| 2016/0126069 A1* | 5/2016 | Kwon | H05B 31/26 315/111.21 |
| 2016/0247666 A1 | 8/2016 | Urakawa et al. | |
| 2016/0351404 A1 | 12/2016 | Aramaki et al. | |
| 2017/0022604 A1* | 1/2017 | Christie | H01J 37/3438 |
| 2017/0062186 A1* | 3/2017 | Coumou | H01J 37/32165 |
| 2018/0204708 A1* | 7/2018 | Tan | H01J 37/321 |
| 2018/0209035 A1 | 7/2018 | Liu et al. | |
| 2019/0206703 A1 | 7/2019 | Zhao et al. | |
| 2019/0362942 A1 | 11/2019 | Shoeb et al. | |
| 2019/0371581 A1 | 12/2019 | Wang et al. | |

FOREIGN PATENT DOCUMENTS

| | | |
|---|---|---|
| JP | 2001-358129 A | 12/2001 |
| JP | 2005-072518 A | 3/2005 |
| JP | 2007-258417 A | 10/2007 |
| JP | 2010-171320 A | 8/2010 |
| JP | 2010-283028 A | 12/2010 |
| JP | 2016-051542 A | 4/2016 |
| JP | 2017-147370 A | 8/2017 |
| JP | 2017-204467 A | 11/2017 |
| JP | 2018-073904 A | 5/2018 |
| KR | 2013-535074 A | 9/2013 |
| WO | 2011/156813 A1 | 12/2011 |

OTHER PUBLICATIONS

An Office Action mailed by the Japan Patent Office dated Nov. 2, 2021, which corresponds to Japanese Patent Application No. 2020-191041 and is related to U.S. Appl. No. 16/891,886; with English translation.

* cited by examiner

PLASMA PROCESSING APPARATUS

CROSS-REFERENCE TO RELATED APPLICATIONS

This application is a Continuation of U.S. patent application Ser. No. 16/752,376 filed Jan. 24, 2020, which is based on and claims the benefit of priority from Japanese Patent Application No. 2019-018833 filed on Feb. 5, 2019 and Japanese Patent Application No. 2019-236679 filed on Dec. 26, 2019, the entire contents of which are incorporated herein by reference.

FIELD

Exemplary embodiments of the present disclosure relate to a plasma processing apparatus.

BACKGROUND

A plasma processing apparatus is used in plasma etching on a substrate. The plasma processing apparatus is provided with a chamber, a substrate support, and two radio frequency power sources. The substrate support includes a lower electrode. The substrate support is configured to support the substrate within the chamber. A gas is supplied into the chamber for plasma processing. In order to generate a plasma from the gas, radio frequency power is supplied from one of the two radio frequency power sources. Further, radio frequency bias power is supplied from the other of the two radio frequency power sources to the lower electrode. Such a plasma processing apparatus is disclosed in Japanese Patent Application Laid-Open Publication No. 2000-173993.

SUMMARY

In an exemplary embodiment, a plasma processing apparatus is provided. The plasma processing apparatus includes a chamber, a substrate support, a radio frequency power source, and a bias power source. The substrate support has a lower electrode. The substrate support is configured to support a substrate in the chamber. The radio frequency power source is configured to generate radio frequency power to generate a plasma from a gas in the chamber. The bias power source is electrically connected to the lower electrode and configured to generate bias power for drawing ions into the substrate support. The bias power source is configured to periodically generate a pulsed negative direct-current voltage as the bias power. The radio frequency power source is configured to supply the radio frequency power as one or more pulses in a first period in which the pulsed negative direct-current voltage is not applied to the lower electrode. The radio frequency power source is configured to stop supply of the radio frequency power in a second period in which the pulsed negative direct-current voltage is applied to the lower electrode. The radio frequency power source is configured to generate the radio frequency power such that each of the one or more pulses has a power level that gradually increases from a point in time of start thereof to a point in time when a peak thereof appears.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
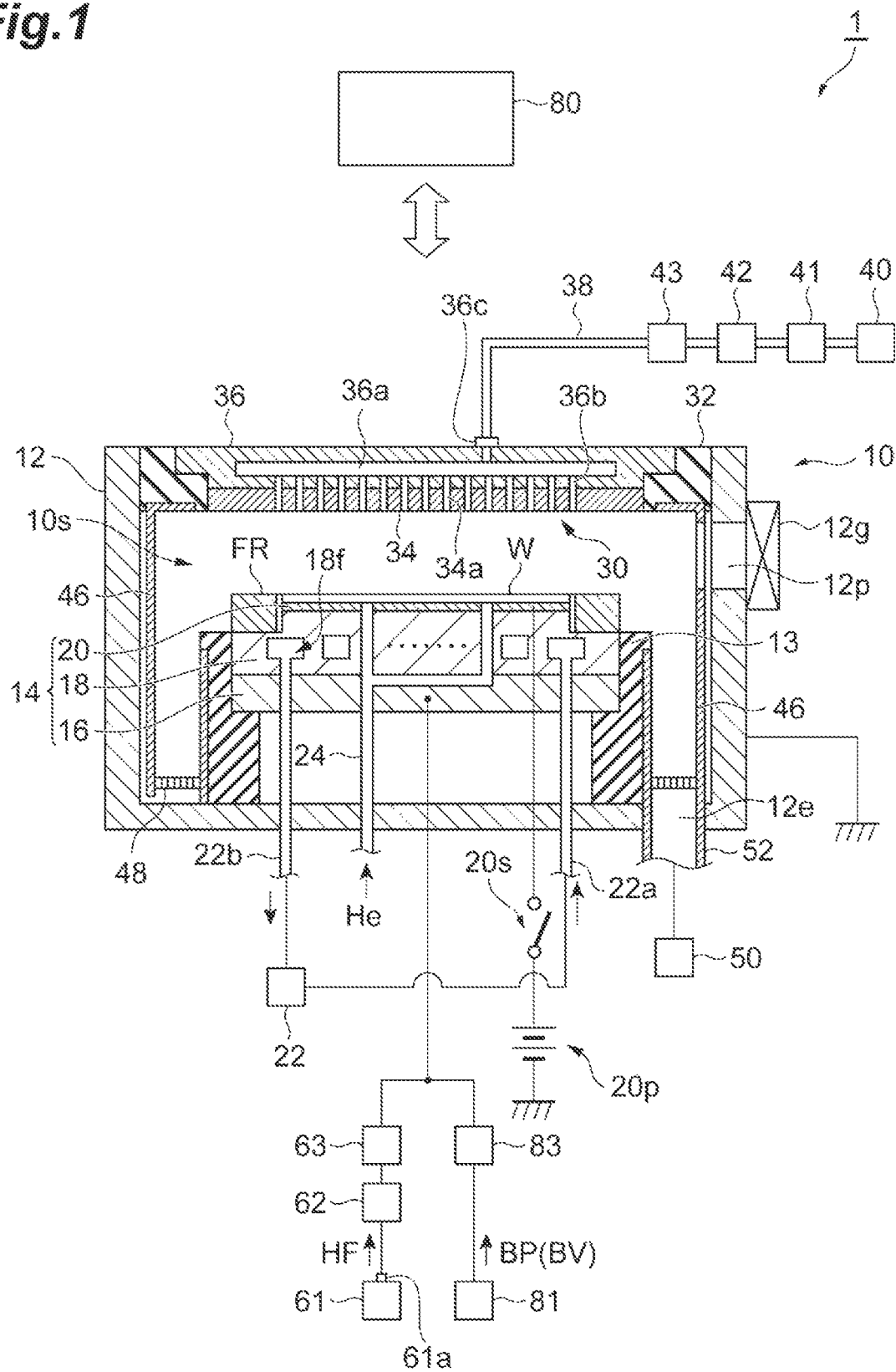
FIG. 1 is a diagram schematically showing a plasma processing apparatus according to an exemplary embodiment.

Hereinafter, various exemplary embodiments will be described.

In an exemplary embodiment, a plasma processing apparatus is provided. The plasma processing apparatus includes a chamber, a substrate support, a radio frequency power source, and a bias power source. The substrate support has a lower electrode. The substrate support is configured to support a substrate in the chamber. The radio frequency power source is configured to generate radio frequency power to generate a plasma from a gas in the chamber. The bias power source is electrically connected to the lower electrode and configured to generate bias power for drawing ions into the substrate support. The bias power source is configured to periodically generate a pulsed negative direct-current voltage as the bias power. The radio frequency power source is configured to supply the radio frequency power as one or more pulses in a first period in which the pulsed negative direct-current voltage is not applied to the lower electrode. The radio frequency power source is configured to stop supply of the radio frequency power in a second period in which the pulsed negative direct-current voltage is applied to the lower electrode. The radio frequency power source is configured to generate the radio frequency power such that each of the one or more pulses has a power level that gradually increases from a point in time of start thereof to a point in time when a peak thereof appears.

In the second period in which the pulsed negative direct-current voltage is applied to the lower electrode, the ions are accelerated from the plasma toward the substrate, and thus etching of the substrate occurs. Therefore, in the second period, a reaction product is released from the substrate. In a case where the electron temperature of the plasma is high, re-dissociation of the reaction product occurs. The substance generated by the re-dissociation of the reaction product may be deposited on the substrate. In the embodiment described above, since the radio frequency power is not supplied in the second period, the electron temperature of the plasma is low in the second period. Therefore, according to the embodiment described above, the re-dissociation of the reaction product is suppressed. Further, in the first period in which the pulsed negative direct-current voltage is not applied to the lower electrode, the radio frequency power is supplied as one or more pulses. The power level of each of the one or more pulses gradually increases to the peak thereof. Therefore, overshoot of the electron temperature is suppressed. As a result, according to the embodiment described above, excessive dissociation of a gas is suppressed.

In an exemplary embodiment, the plasma processing apparatus may further include a controller configured to control the bias power source to set a phase of a cycle of the pulsed negative direct-current voltage. According to this embodiment, it becomes possible to adjust a time difference between the point in time of end of the supply of one or more pulses and the point in time when the application of the pulsed negative direct-current voltage to the lower electrode is started. Therefore, it is possible to adjust the electron temperature of the plasma before the application of the pulsed negative direct-current voltage to the lower electrode is started.

In an exemplary embodiment, the controller may further control the bias power source to set a duration length of the pulsed negative direct-current voltage. According to this embodiment, it becomes possible to adjust a time difference between the point in time of end of the application of the pulsed negative direct-current voltage to the lower electrode and the point in time when the supply of the one or more pulses is started.

In another exemplary embodiment, a plasma processing apparatus is also provided. The plasma processing apparatus includes a chamber, a substrate support, a radio frequency power source, and a bias power source. The substrate support has a lower electrode. The substrate support is configured to support a substrate in the chamber. The radio frequency power source is configured to generate radio frequency power to generate a plasma from a gas in the chamber. The bias power source is electrically connected to the lower electrode and configured to generate bias power for drawing ions into the substrate support. The bias power source is configured to generate radio frequency bias power as the bias power. The radio frequency power source is configured to supply the radio frequency power as one or more pulses in a first period in which the radio frequency bias power which is output from the bias power source has a positive voltage. The radio frequency power source is configured to stop the supply of the radio frequency power in a second period in which the radio frequency bias power which is output from the bias power source has a negative voltage. The radio frequency power source is configured to generate the pulsed radio frequency power such that each of the one or more pulses has a power level that gradually increases from the point in time of start thereof to the point in time when a peak thereof appears.

In the second period in which the radio frequency bias power which is output from the bias power source has a negative voltage, the ions are accelerated from the plasma toward the substrate, and thus etching of the substrate occurs. Therefore, in the second period, a reaction product is released from the substrate. In a case where the electron temperature of the plasma is high, re-dissociation of the reaction product occurs. The substance generated by the re-dissociation of the reaction product may be deposited on the substrate. In the embodiment described above, since the radio frequency power is not supplied in the second period, the electron temperature of the plasma is low in the second period. Therefore, according to the embodiment described above, the re-dissociation of the reaction product is suppressed. Further, in the first period in which the radio frequency bias power which is output from the bias power source has a positive voltage, the radio frequency power is supplied as one or more pulses. The power level of each of the one or more pulses gradually increases to the peak thereof. Therefore, overshoot of the electron temperature is suppressed. As a result, according to the embodiment described above, excessive dissociation of a gas is suppressed.

In an exemplary embodiment, the plasma processing apparatus may further include a controller configured to control the bias power source to set a phase of the radio frequency bias power. According to this embodiment, it becomes possible to adjust a time difference between the point in time of end of the supply of the one or more pulses and the point in time when the potential of the lower electrode has a negative peak.

In an exemplary embodiment, a rise time of each of the one or more pulses may be longer than a minimum rise time of a pulse of radio frequency power capable of being output from the radio frequency power source.

In an exemplary embodiment, the radio frequency power source may include a power generator and an output. The power generator is configured to generate the radio frequency power. The output is configured to output the radio frequency power generated by the power generator.

In an exemplary embodiment, the radio frequency power which is generated by the power generator includes a plurality of power components. The plurality of power components have a plurality of frequencies, respectively. The plurality of frequencies are set symmetrically with respect to a fundamental frequency at an interval of a predetermined frequency. An envelope of the radio frequency power has a peak that periodically appears at a time interval which is defined by the predetermined frequency or a frequency that is a multiple of twice or more the predetermined frequency. A power level of the radio frequency power is set to be zero in a period excluding a period between a zero-cross region of the envelope immediately before a point in time of appearance of each of the peaks and a zero-cross region of the envelope immediately after the point in time of the appearance.

In an exemplary embodiment, the power generator may include a waveform data generator, a quantize, an inverse Fourier transformer, and a modulator. The quantizer is configured to quantize waveform data generated by the waveform data generator to generate quantized data. The inverse Fourier transformer is configured to generate I data and Q data by applying inverse Fourier transform to the quantized data. The modulator is configured to generate a modulated radio frequency signal by modulating two reference radio frequency signals of which phases are different from each other by 90° by using the I data and the Q data. In this embodiment, the power generator is configured to generate the radio frequency power from the modulated radio frequency signal.

In an exemplary embodiment, the power generator may further include an amplifier configured to amplify the modulated radio frequency signal to generate the radio frequency power.

In an exemplary embodiment, the radio frequency power source may be configured to be capable of adjusting a rise time of each of the one or more pulses.

In an exemplary embodiment, the radio frequency power source may be configured to sequentially supply a plurality of pulses as the one or more pulses in the first period.

Hereinafter, various embodiments will be described in detail with reference to the drawings. In the drawing, the same or equivalent portions are denoted by the same reference symbols.

FIG. 1 is a diagram schematically showing a plasma processing apparatus according to an exemplary embodiment. A plasma processing apparatus 1 shown in FIG. 1 is a capacitively coupled plasma processing apparatus. The plasma processing apparatus 1 is provided with a chamber 10. The chamber 10 provides an internal space 10s therein.

The chamber 10 includes a chamber body 12. The chamber body 12 has a substantially cylindrical shape. The internal space 10s is provided inside the chamber body 12. The chamber body 12 is formed of, for example, aluminum. A film having corrosion resistance is provided on the inner wall surface of the chamber body 12. The film having corrosion resistance may be a film formed of ceramic such as aluminum oxide or yttrium oxide.

A passage 12p is formed in the side wall of the chamber body 12. A substrate W passes through the passage 12p when it is transferred between the internal space 10s and the outside of the chamber 10. The passage 12p is made to be able to be opened and closed by a gate valve 12g. The gate valve 12g is provided along the side wall of the chamber body 12.

A support 13 is provided on a bottom portion of the chamber body 12. The support 13 is formed of an insulating material. The support 13 has a substantially cylindrical shape. The support 13 extends upward from the bottom portion of the chamber body 12 in the internal space 10s. The support 13 supports a substrate support 14. The substrate support 14 is configured to support the substrate W in the internal space 10s.

The substrate support 14 includes a lower electrode 18 and an electrostatic chuck 20. The substrate support 14 may further include an electrode plate 16. The electrode plate 16, the lower electrode 18, and the electrostatic chuck 20 are provided in the chamber 10. The electrode plate 16 is formed of a conductor such as aluminum, for example, and has a substantially disk shape. The lower electrode 18 is provided on the electrode plate 16. The lower electrode 18 is formed of a conductor such as aluminum, for example, and has a substantially disk shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 has a main body and an electrode. The main body of the electrostatic chuck 20 has a substantially disk shape and is formed of a dielectric. The electrode of the electrostatic chuck 20 is a film-shaped electrode and is provided in the main body of the electrostatic chuck 20. The electrode of the electrostatic chuck 20 is connected to a direct-current power source 20p through a switch 20s. When the voltage from the direct-current power source 20p is applied to the electrode of the electrostatic chuck 20, an electrostatic attraction force is generated between the electrostatic chuck 20 and the substrate W. Due to the generated electrostatic attraction force, the substrate W is attracted to the electrostatic chuck 20 and held by the electrostatic chuck 20.

A focus ring FR is mounted on a peripheral edge portion of the substrate support 14. The focus ring FR is provided in order to improve the in-plane uniformity of plasma processing on the substrate W. The focus ring FR is substantially plate-shaped and annular. The focus ring FR may be formed of silicon, silicon carbide, or quartz, but not limited thereto. The substrate W is disposed on the electrostatic chuck 20 and in a region surrounded by the focus ring FR.

A flow path 18f is provided in the interior of the lower electrode 18. A heat exchange medium (for example, a refrigerant) is supplied from a chiller unit 22 provided outside the chamber 10 to the flow path 18f through a pipe 22a. The heat exchange medium supplied to the flow path 18f is returned to the chiller unit 22 through a pipe 22b. In the plasma processing apparatus 1, the temperature of the substrate W placed on the electrostatic chuck 20 is adjusted by the heat exchange between the heat exchange medium and the lower electrode 18.

The plasma processing apparatus 1 is provided with a gas supply line 24. The gas supply line 24 supplies a heat transfer gas (for example, He gas) from a heat transfer gas supply mechanism to the gap between the upper surface of the electrostatic chuck 20 and the back surface of the substrate W.

The plasma processing apparatus 1 further includes an upper electrode 30. The upper electrode 30 is provided above the substrate support 14. The upper electrode 30 is supported on an upper portion of the chamber body 12 through a member 32. The member 32 is formed of a material having insulation properties. The upper electrode 30 and the member 32 close the upper opening of the chamber body 12.

The upper electrode 30 may include a top plate 34 and a support 36. The lower surface of the top plate 34 is a lower surface on the internal space 10s side and defines the internal space 10s. The top plate 34 may be formed of a low resistance conductor or semiconductor with low Joule heat. A plurality of gas discharge holes 34a are formed in the top plate 34. The plurality of gas discharge holes 34a penetrate the top plate 34 in a plate thickness direction thereof.

The support 36 detachably supports the top plate 34. The support 36 is formed of a conductive material such as aluminum. A gas diffusion chamber 36a is provided in the interior of the support 36. A plurality of gas holes 36b are formed in the support 36. The plurality of gas holes 36b extend downward from the gas diffusion chamber 36a. The plurality of gas holes 36b respectively communicate with the plurality of gas discharge holes 34a. A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40 includes a plurality of gas sources. Each of the valve group 41 and the valve group 43 includes a plurality of on-off valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding on-off valve of the valve group 41, a corresponding flow rate controller of the flow rate controller group 42, and a corresponding on-off valve of the valve group 43.

In the plasma processing apparatus 1, a shield 46 is detachably provided along the inner wall surface of the chamber body 12. The shield 46 is also provided on the outer periphery of the support 13. The shield 46 prevents an etching byproduct from adhering to the chamber body 12. The shield 46 is configured, for example, by forming a film having corrosion resistance on the surface of a member formed of aluminum. The film having corrosion resistance may be a film formed of ceramic such as yttrium oxide.

A baffle plate 48 is provided between the support 13 and the side wall of the chamber body 12. The baffle plate 48 is configured, for example, by forming a film having corrosion resistance on the surface of a member formed of aluminum. The film having corrosion resistance may be a film formed of ceramic such as yttrium oxide. A plurality of through-holes are formed in the baffle plate 48. An exhaust port 12e is provided below the baffle plate 48 and in the bottom portion of the chamber body 12. An exhaust device 50 is connected to the exhaust port 12e through an exhaust pipe 52. The exhaust device 50 has a pressure adjusting valve and a vacuum pump such as a turbo molecular pump.

The plasma processing apparatus 1 further includes a radio frequency power source 61. The radio frequency power source 61 is configured to generate radio frequency power HF. The fundamental frequency of the radio frequency power HF is a frequency in a range of 13 MHz to 200 MHz, for example. The radio frequency power source 61 supplies the radio frequency power HF to generate a plasma from the gas in the chamber 10. The radio frequency power source 61 is electrically connected to the lower electrode 18 through a matcher 62. The matcher 62 has a matching circuit. The matching circuit of the matcher 62 is configured to match the impedance on the load side (lower electrode side) of the radio frequency power source 61 with the output impedance of the radio frequency power source 61. A filter 63 may be provided between the matcher 62 and the lower electrode 18. The filter 63 is configured to pass the radio frequency power HF and reduce or cut off other signals directed to the radio frequency power source 61. In another embodiment, the radio frequency power source 61 may be electrically connected to the upper electrode 30 through the matcher 62.

The plasma processing apparatus 1 further includes a bias power source 81. The bias power source 81 is electrically connected to the lower electrode 18. The bias power source 81 is configured to generate bias power BP to draw ions into the substrate support 14. The bias power BP is supplied to the lower electrode 18. A filter 83 may be provided between the bias power source 81 and the lower electrode 18. The filter 83 is configured to pass the bias power BP and reduce or cut off other signals directed to the bias power source 81.

Figure 2:
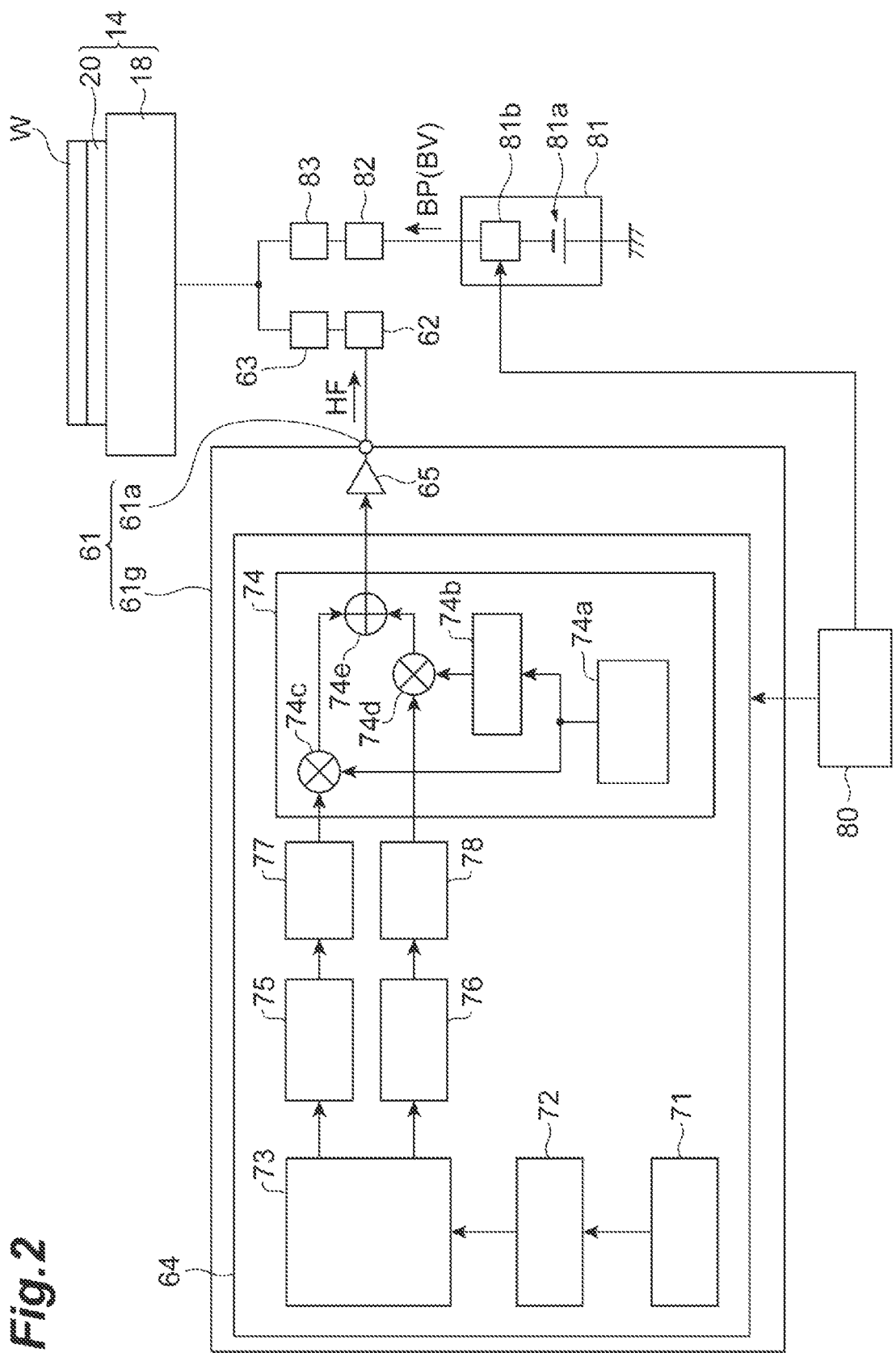
FIG. 2 is a diagram showing a configuration of a radio frequency power source and a bias power source of a plasma processing apparatus according to an exemplary embodiment.
Figure 3:
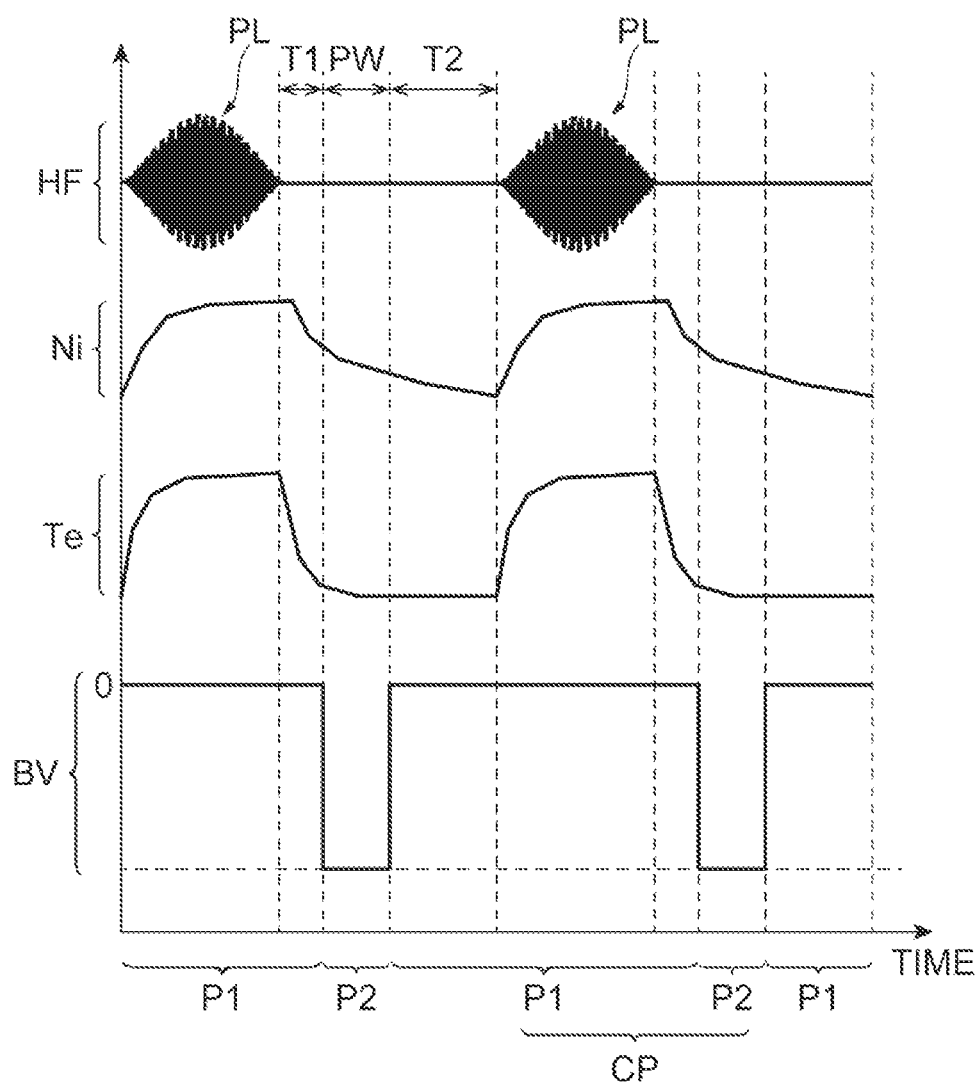
FIG. 3 is an exemplary timing chart of radio frequency power, ion density, an electron temperature, and bias power.

Hereinafter, FIGS. 2 and 3 will be referred to together with FIG. 1. FIG. 2 is a diagram showing a configuration of a radio frequency power source and a bias power source of a plasma processing apparatus according to an exemplary embodiment. FIG. 3 is an exemplary timing chart of radio frequency power (HF), ion density (Ni), an electron temperature (Te), and bias power (pulsed negative direct-current voltage BV).

In an embodiment, the bias power source 81 is configured to periodically generate a pulsed negative direct-current voltage BV as the bias power BP with a cycle CP. The direct-current voltage BV is applied to the lower electrode 18. The repetition frequency of the pulsed negative direct-current voltage BV, that is, the reciprocal of the cycle CP is a frequency in a range of 1 kHz to 800 kHz, for example.

In an embodiment, the bias power source 81 may include a direct-current power source 81a and a switching element 81b. The direct-current power source 81a is a direct-current power source that generates a negative direct-current voltage. The direct-current power source 81a may be a variable direct-current power source. The switching element 81b is connected between the direct-current power source 81a and the lower electrode 18. If the switching element 81b enters a conduction state, conduction is made between the direct-current power source 81a and to the lower electrode 18, so that a negative direct-current voltage is applied to the lower electrode 18. On the other hand, if the switching element 81b enters a non-conduction state, the direct-current power source 81a is electrically disconnected from the lower electrode 18, so that the application of the negative direct-current voltage to the lower electrode 18 is stopped. Due to the state transition of the switching element 81b, the pulsed negative direct-current voltage BV is generated. The conduction state and non-conduction state of the switching element 81b are controlled by a controller 80 (described later) or another controller.

The radio frequency power source 61 is configured to supply the radio frequency power HF as one or more pulses PL in a first period P1. In the case of the plasma processing apparatus 1, the first period P1 is a period in which the pulsed negative direct-current voltage BV is not applied to the lower electrode 18. In the example shown in FIG. 3, one pulse PL of the radio frequency power HF is supplied in a single first period P1.

The radio frequency power source 61 is configured to stop the supply of the radio frequency power HF in a second period P2. In the case of the plasma processing apparatus 1, the second period P2 is a period in which the pulsed negative direct-current voltage BV is applied to the lower electrode 18.

The radio frequency power source 61 generates the radio frequency power HF such that each pulse PL has a power level that gradually increases from the point in time of the start thereof to the point in time when the peak thereof appears. A rise time of each pulse PL of the radio frequency power HF may be set to a time longer than the minimum rise time of the pulse of the radio frequency power that can be output from the radio frequency power source 61.

The ions in the plasma in the chamber 10 are accelerated toward the substrate W in the second period P2. As a result, the substrate W is etched in the second period P2. Therefore, in the second period P2, a reaction product is released from the substrate W. In a case where the electron temperature of the plasma is high, re-dissociation of the reaction product occurs in the plasma. The substance generated by the re-dissociation of the reaction product may be deposited on the substrate W. In the plasma processing apparatus 1, since the radio frequency power HF is not supplied in the second period P2, the electron temperature of the plasma is low in the second period P2. Therefore, according to the plasma processing apparatus 1, the re-dissociation of the reaction product is suppressed. If the re-dissociation of the reaction product is suppressed, the formation of the deposit on the substrate W is suppressed. As a result, a reduction or clogging of an opening formed in the substrate W by plasma etching is suppressed.

Further, in the first period P1, the radio frequency power HF is supplied as one or more pulses PL. The power level of each pulse PL gradually increases to the peak thereof. Therefore, overshoot of the electron temperature is suppressed. As a result, according to the plasma processing apparatus 1, excessive dissociation of gas is suppressed. Therefore, according to the plasma processing apparatus 1, it becomes possible to etch the substrate W at a relatively high etching rate.

In an embodiment, as shown in FIG. 2, the radio frequency power source 61 may include a power generator 61g and an output 61a. The power generator 61g is configured to generate the radio frequency power HF. The output 61a is configured to output the radio frequency power HF generated by the power generator 61g. The output 61a is electrically connected to the lower electrode 18 through the matcher 62.

Figure 4A:
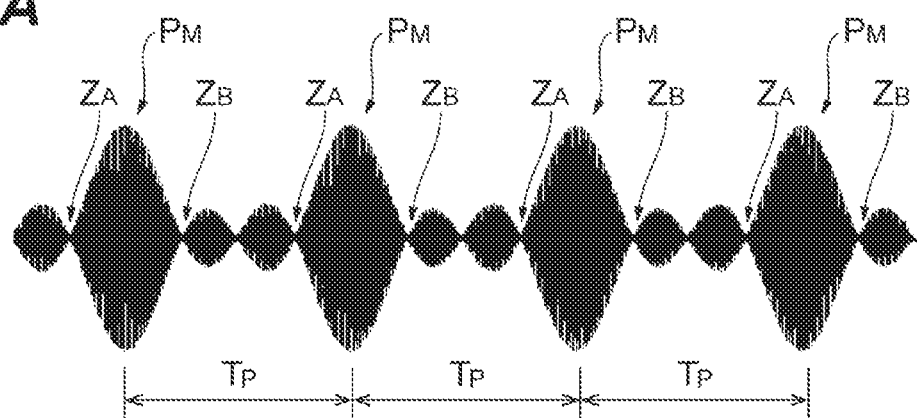
FIG. 4A is a diagram showing an example of a waveform of combined power of a plurality of power components.
Figure 4B:
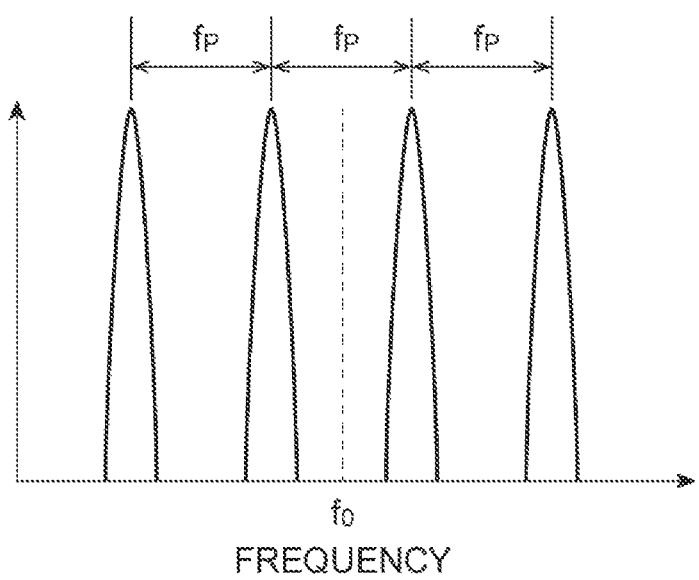
FIG. 4B is a diagram showing a power spectrum of the combined power shown in FIG. 4A.
Figure 4C:
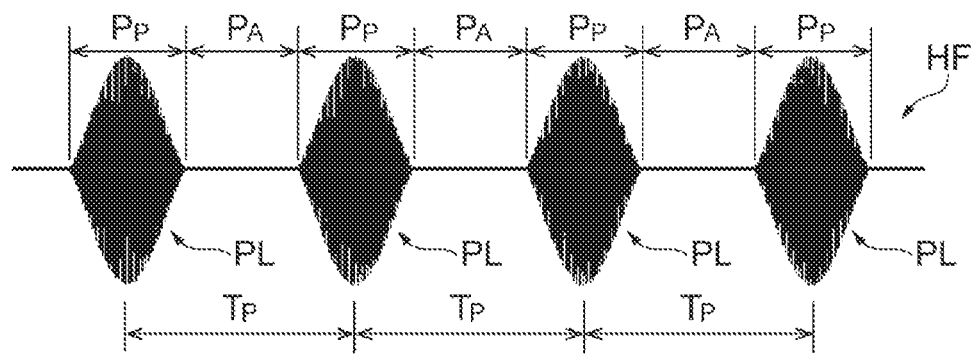
FIG. 4C is a diagram showing a waveform of radio frequency power HF of an example.

FIG. 4A is a diagram showing an example of a waveform of combined power of a plurality of power components, FIG. 4B is a diagram showing a power spectrum of the combined power shown in FIG. 4A, and FIG. 4C is a diagram showing the waveform of the radio frequency power HF of an example. As shown in FIG. 4C, the radio frequency power HF is pulsed radio frequency power which is supplied periodically. That is, the radio frequency power HF includes the pulse PL that appears periodically.

In an embodiment, the radio frequency power HF includes a plurality of power components. The plurality of power components have a plurality of frequencies, respectively. As shown in FIG. 4B, the plurality of frequencies are set symmetrically with respect to a fundamental frequency $f_0$. The fundamental frequency $f_0$ is a frequency in a range of 13 MHz to 200 MHz, for example. In an example, the fundamental frequency $f_0$ is 40.68 MHz. Further, as shown in FIG. 4B, the plurality of frequencies are set at an interval of a predetermined frequency $f_P$. In an embodiment, the frequency $f_P$ is the reciprocal of the cycle CP. In the example shown in FIG. 4B, the respective frequencies of the plurality of power components are $f_0-(3/2) \times f_P$, $f_0-f_P/2$, $f_0+f_P/2$, and $f_0+(3/2) \times f_P$.

The envelope of the combined power of the plurality of power components includes a plurality of peak groups, as shown in FIG. 4A. Each of the plurality of peak groups includes a plurality of peaks that appear periodically. A plurality of peaks which are included in each of the plurality of peak groups periodically appear at a time interval $T_P$. The time interval $T_P$ is the reciprocal of the frequency $f_P$.

As shown in FIG. 4C, the envelope of the radio frequency power HF has a peak that appears at the time interval $T_P$. In an embodiment, the radio frequency power HF is composed of a peak group which includes peaks $P_M$ having the maximum power level among the plurality of peak groups. As shown in FIG. 4C, the radio frequency power HF is set such that the power level thereof is zero in periods $P_A$. The periods $P_A$ are periods excluding periods $P_P$. The periods $P_P$ are periods in which the peaks of the envelope of the radio frequency power HF appear, respectively. In an embodiment, the periods $P_P$ are periods in which peaks $P_M$ appear, respectively. Each of the periods $P_P$ is a period between a zero-cross region $Z_A$ of the envelope immediately before the point in time when a corresponding peak of the envelope of the radio frequency power HF appears and a zero-cross region $Z_B$ of the envelope immediately after the point in time of the appearance. The zero-cross region $Z_A$ and the zero-cross region $Z_B$ may be points in time at which the amplitude of the envelope of the radio frequency power HF has a value that can be regarded as substantially zero. For example, each of the zero-cross region $Z_A$ and the zero-cross region $Z_B$ may be a point in time at which the power level of the envelope has a power level of 30% or less or 10% or less with respect to the power level of the peak of the envelope of the radio frequency power HF.

As shown in FIG. 4C, each pulse of the radio frequency power HF has a power level that gradually increases to the peak thereof. Further, each pulse has a power level that gradually decreases from the peak thereof. In the period $P_A$ excluding the period $P_P$ between the zero-cross region $Z_A$ immediately before each pulse and the zero-cross region $Z_B$ immediately after each pulse, that is, the period excluding the duration of each pulse, the power level of the radio frequency power HF is set to zero. The bandwidth of the radio frequency power HF is narrow. Therefore, according to the radio frequency power source 61 of an embodiment, it becomes possible to narrow the bandwidth of the pulsed radio frequency power HF. Therefore, according to the plasma processing apparatus 1, it becomes possible to suppress the reflected wave with respect to the radio frequency power HF.

In an embodiment, the power generator 61g may include a modulated signal generator 64, as shown in FIG. 2. In an embodiment, the power generator 61g may further include an amplifier 65. The modulated signal generator 64 generates a modulated radio frequency signal. The radio frequency power HF may be the modulated radio frequency signal which is generated by the modulated signal generator 64. In this case, the amplifier 65 is not necessary. Alternatively, the radio frequency power HF may be generated by amplifying the modulated radio frequency signal by the amplifier 65.

In an embodiment, the modulated signal generator 64 includes a waveform data generator 71, a quantizer 72, an inverse Fourier transformer 73, and a modulator 74. In an embodiment, the modulated signal generator 64 may further include D/A converters 75 and 76 and low-pass filters 77 and 78. The modulated signal generator 64 may be configured with, for example, an FPGA (Field-Programmable Gate Array). Alternatively, the modulated signal generator 64 may be formed of several circuits.

The waveform data generator 71 generates waveform data corresponding to the modulated radio frequency signal. The waveform data generator 71 is configured to acquire parameters (for example, a frequency, a phase, and the like) for generating the waveform data from the input device and generate the waveform data by using the acquired parameters. The waveform data generator 71 outputs the generated waveform data to the quantizer 72.

The quantizer 72 is configured to quantize the waveform data generated by the waveform data generator 71 to generate quantized data. The inverse Fourier transformer 73 is configured to generate I data (in-phase component) and Q data (quadrature phase component) by applying inverse Fourier transform to the quantized data. The I data and the Q data are input to the modulator 74 via the D/A converters 75 and 76 and the low-pass filters 77 and 78, respectively.

The modulator 74 is configured to generate a modulated radio frequency signal by modulating two reference radio frequency signals of which phases are different from each other by 90° by using the input I data and Q data, respectively.

In an embodiment, the modulator 74 includes a PLL oscillator 74a (Phase Locked Loop Oscillator), a phase shifter 74b, mixers 74c and 74d, and a synthesizer 74e.

The PLL oscillator 74a is configured to generate a reference radio frequency signal. The reference radio frequency signal is input to the mixer 74c. Further, the reference radio frequency signal is input to the phase shifter 74b. The phase shifter 74b is configured to generate a reference radio frequency signal having a phase that is different by 90° from the phase of the reference radio frequency signal which is input to the mixer 74c. Specifically, the phase shifter 74b is configured to shift the phase of the input reference radio frequency signal by 90°. The reference radio frequency signal generated by the phase shifter 74b is input to the mixer 74d.

The mixer 74c is configured to perform the multiplication of the input reference radio frequency signal and the I data. The signal generated by the multiplication of the mixer 74c is input to the synthesizer 74e. The mixer 74d is configured to perform the multiplication of the input reference radio frequency signal and the Q data. The signal generated by the multiplication of the mixer 74d is input to the synthesizer 74e. The synthesizer 74e is configured to add the signals input from the mixer 74c and the mixer 74d to generate the modulated radio frequency signal.

In an embodiment, the plasma processing apparatus 1 may further include the controller 80. The controller 80 may be a computer which includes a processor, a storage unit such as a memory, an input device, a display device, a signal input/output interface, and the like. The controller 80 controls each part of the plasma processing apparatus 1. In the controller 80, an operator can perform a command input operation and the like by using the input device in order to manage the plasma processing apparatus 1. Further, in the controller 80, the operating status of the plasma processing apparatus 1 can be visualized and displayed by the display device. Further, a control program and recipe data are stored in the storage unit of the controller 80. The control program is executed by the processor of the controller 80 in order to execute various processing in the plasma processing apparatus 1. The processor of the controller 80 executes the control program and controls each part of the plasma processing apparatus 1 according to the recipe data, whereby plasma processing is executed in the plasma processing apparatus 1.

In an embodiment, the controller 80 or another controller may control the phase of the bias power source 81 to set the phase of the cycle CP of the direct-current voltage By. According to this embodiment, it becomes possible to adjust a time difference T1 (refer to FIG. 3) between the point in time of end of the supply of the pulse PL and the point in time of start of the application of the pulsed negative direct-current voltage BV to the lower electrode 18. Therefore, it is possible to adjust the electron temperature of the plasma before the application of the pulsed negative direct-current voltage BV to the lower electrode 18 is started.

More specifically, the controller 80 or another controller controls the bias power source 81 to set the phase of the negative direct-current voltage BV, that is, the supply start timing of the negative direct-current voltage By. In an embodiment, the controller 80 or another controller controls the timing at which the switching element 81b switches from the non-conduction state to the conduction state. In this way, the time difference T1 is controlled.

In an embodiment, the controller 80 or another controller may further control the bias power source 81 to set a duration length PW (FIG. 3) of the pulsed negative direct-current voltage By. In an embodiment, the controller 80 or another controller sets the duration length PW by controlling the length of a time when the switching element 81b maintains the conduction state. In this way, it becomes possible to adjust a time difference T2 (FIG. 3) between the point in time of end of the application of the pulsed negative direct-current voltage BV to the lower electrode 18 and the point in time of start of the supply of the pulse PL.

Figure 5A:
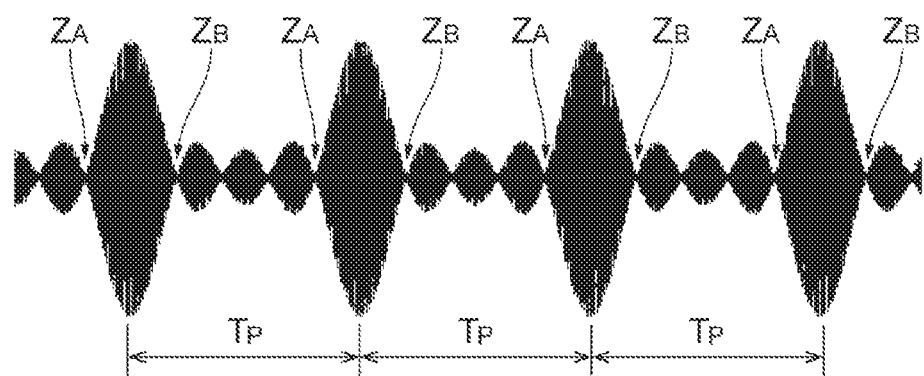
FIG. 5A is a diagram showing an example of a waveform of combined power of a plurality of power components.
Figure 5B:
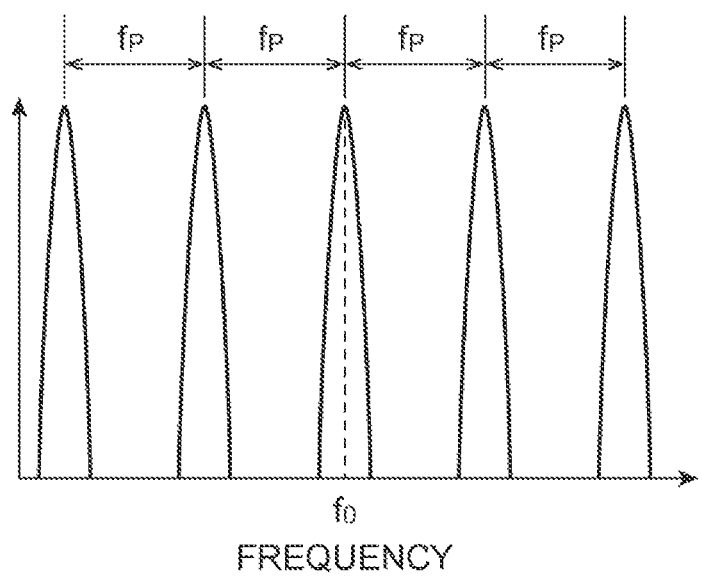
FIG. 5B is a diagram showing a power spectrum of the combined power shown in FIG. 5A.
Figure 5C:
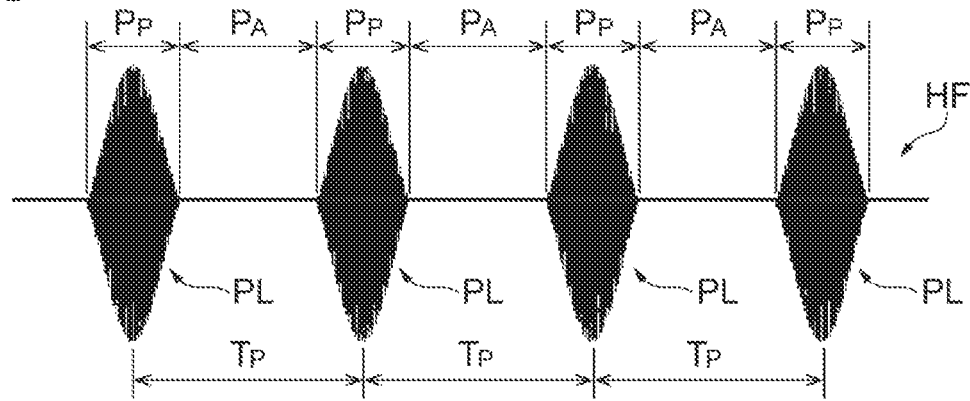
FIG. 5C is a diagram showing a waveform of radio frequency power HF of an example.

Hereinafter, FIGS. 5A, 5B, and 5C will be referred to. In another example, as shown in FIG. 5B, the frequencies of the plurality of power components of the radio frequency power HF are $f_0-2\times f_P$, $f_0-f_P$, $f_0$, $f_0+f_P$, and $f_0+2\times f_P$. In this example, as shown in FIG. 5A, the envelope of the combined power of the plurality of power components includes four peak groups. In this example, as shown in FIG. 5C, the radio frequency power HF is composed of a peak group which includes the maximum peaks among the four peak groups. It should be noted that the radio frequency power HF may be composed of two or more power components. The respective frequencies of the two or more power components are set symmetrically with respect to the fundamental frequency $f_0$ and are set at an interval which is defined by a predetermined frequency $f_P$.

Figure 6:
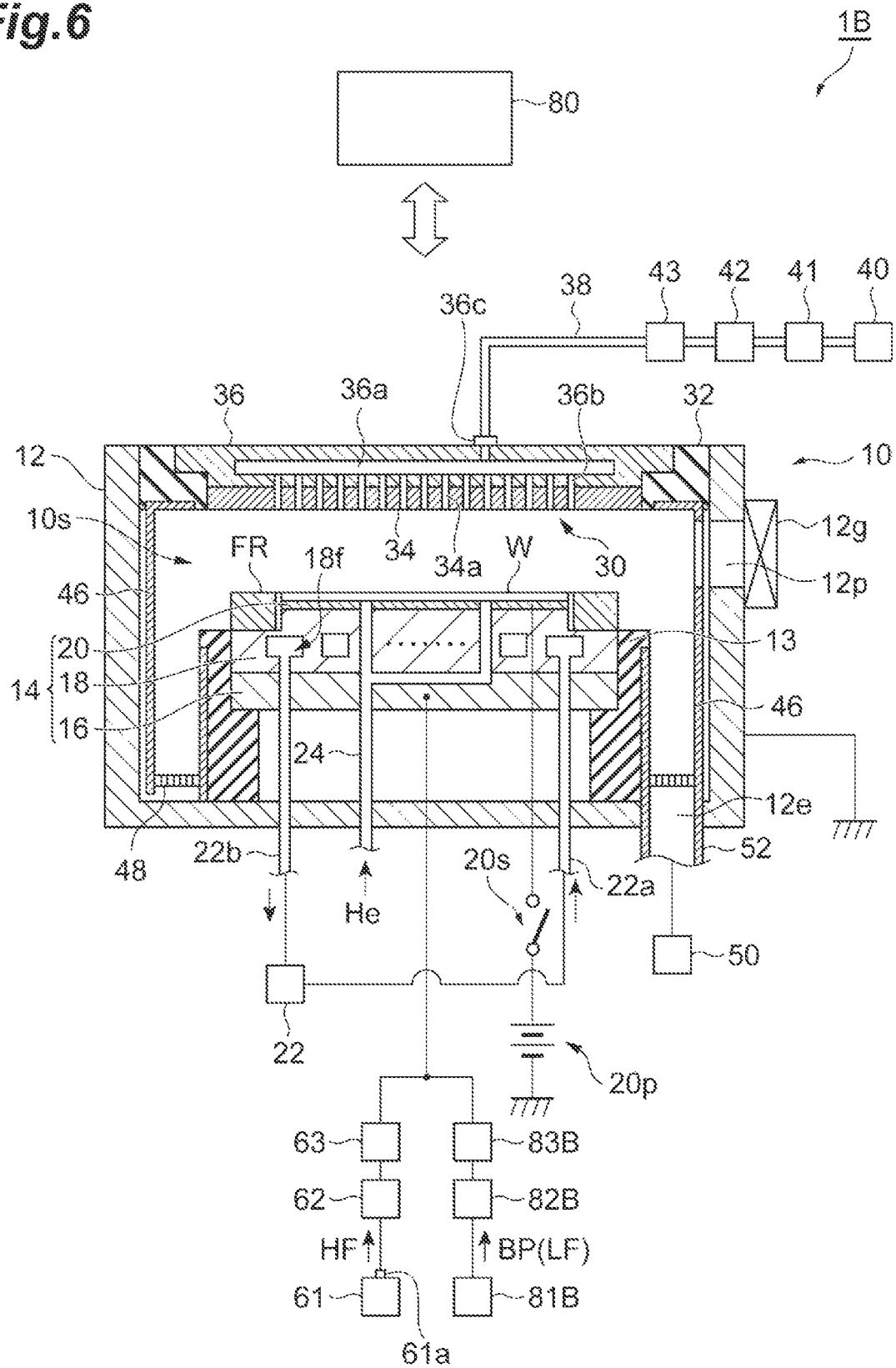
FIG. 6 is a diagram schematically showing a plasma processing apparatus according to another exemplary embodiment.
Figure 7:
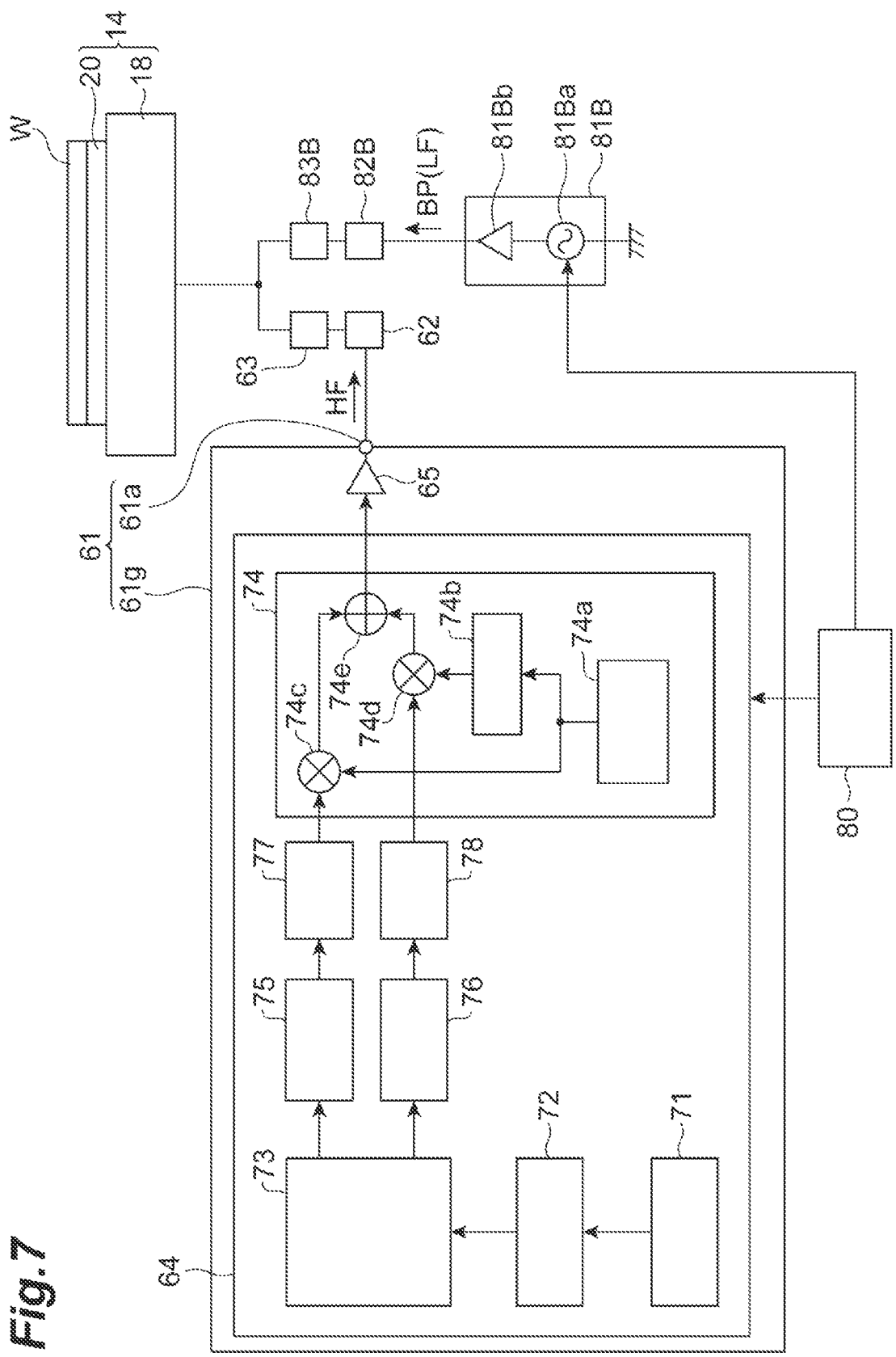
FIG. 7 is a diagram showing a configuration of a radio frequency power source and a bias power source of a plasma processing apparatus according to another exemplary embodiment.
Figure 8:
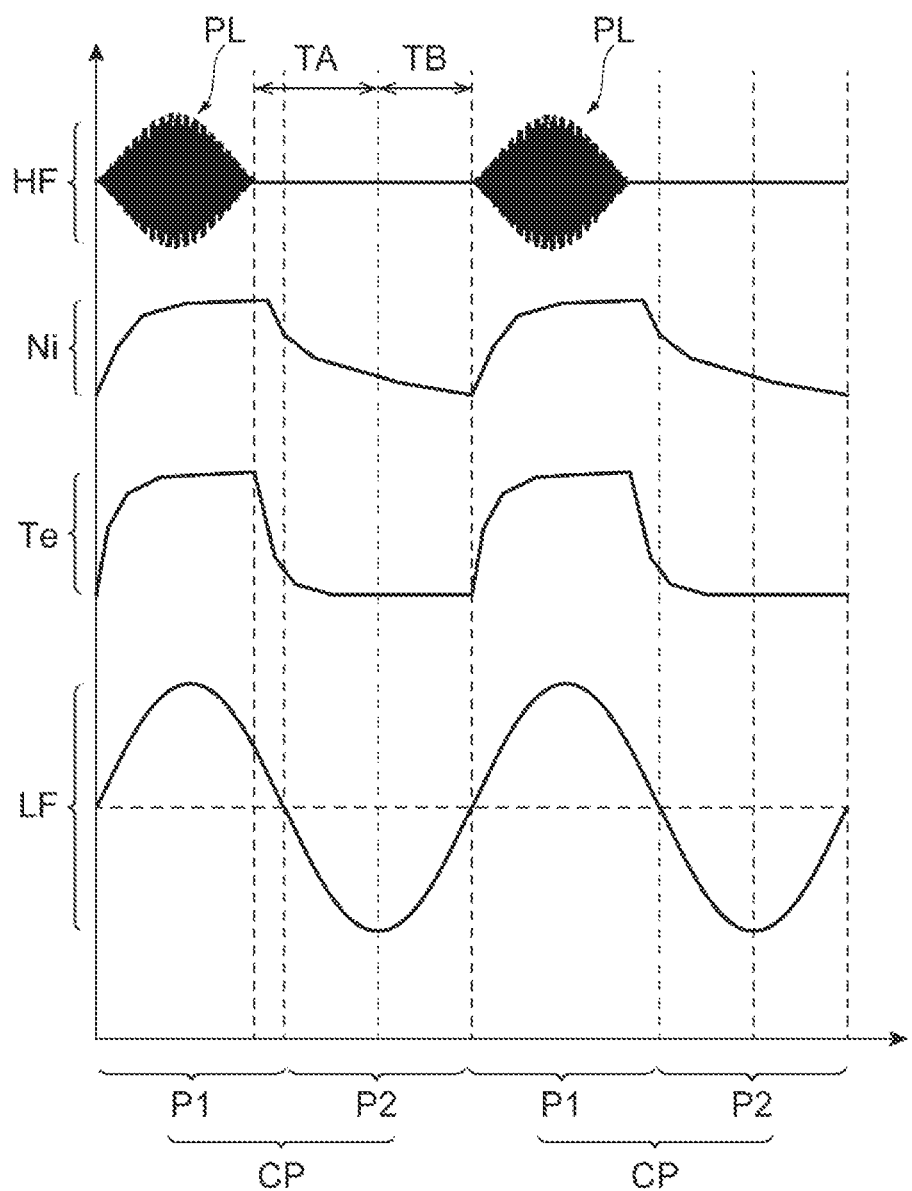
FIG. 8 is another exemplary timing chart of radio frequency power, ion density, an electron temperature, and bias power.

Hereinafter, a plasma processing apparatus according to another embodiment will be described with reference to FIGS. 6, 7, and 8. FIG. 6 is a diagram schematically showing the plasma processing apparatus according to another exemplary embodiment. FIG. 7 is a diagram showing a configuration of a radio frequency power source and a bias power source of the plasma processing apparatus according to another exemplary embodiment. FIG. 8 is another exemplary timing chart of the radio frequency power (HF), the ion density (Ni), the electron temperature (Te), and the bias power (radio frequency bias power LF).

A plasma processing apparatus 1B according to another embodiment includes a bias power source 81B and a filter 83B instead of the bias power source 81 and the filter 83. The plasma processing apparatus 1B further includes a matcher 82B. In other respects, the plasma processing apparatus 1B is configured in the same manner as the plasma processing apparatus 1.

The bias power source 81B is configured to generate the radio frequency bias power LF as the bias power BP for drawing ions into the substrate support 14. The frequency of the radio frequency bias power LF is the reciprocal of the cycle CP. The frequency of the radio frequency bias power LF is lower than the fundamental frequency $f_0$. The frequency of the radio frequency bias power LF is a frequency in a range of 400 kHz to 13.56 MHz, for example. In an example, the frequency of the radio frequency bias power LF is 400 kHz. In an embodiment, the frequency of the radio frequency bias power LF may be the frequency $f_P$ described above. The radio frequency bias power LF is supplied to the lower electrode 18.

The bias power source 81B is electrically connected to the lower electrode 18 through a matcher 82B. The matcher 82B has a matching circuit. The matching circuit of the matcher 82B is configured to match the impedance on the load side (lower electrode side) of the bias power source 81B with the output impedance of the bias power source 81B. A filter 83B may be provided between the matcher 82B and the lower electrode 18. The filter 83B is configured to pass the radio frequency bias power LF and reduce or cut off other signals directed to the bias power source 81B.

As shown in FIG. 7, in an embodiment, the bias power source 81B may include a signal generator 81Ba and an amplifier 81Bb. The signal generator 81Ba is configured to generate a radio frequency signal having the same frequency as the frequency of the radio frequency bias power LF. The radio frequency signal generated by the signal generator 81Ba is input to the amplifier 81Bb. The amplifier 81Bb is configured to amplify the input radio frequency signal to generate the radio frequency bias power LF.

In the plasma processing apparatus 1B, the radio frequency power source 61 is configured to supply the radio frequency power HF as one or more pulses PL in the first period P1 in which the radio frequency bias power LF which is output from the bias power source 81B has a positive voltage, as shown in FIG. 8. In the example shown in FIG. 8, one pulse PL of the radio frequency power HF is supplied in a single first period P1.

In the plasma processing apparatus 1B, the radio frequency power source 61 is configured to stop the supply of the radio frequency power HF in the second period P2 in which the radio frequency bias power LF which is output from the bias power source 81B has a negative voltage.

Also in the plasma processing apparatus 1B, similar to the plasma processing apparatus 1, the radio frequency power source 61 generates the radio frequency power HF such that each pulse PL has a power level that gradually increases from the point in time of the start thereof to the point in time when the peak thereof appears. Also in the plasma processing apparatus 1B, similar to the plasma processing apparatus 1, the rise time of each pulse PL of the radio frequency power HF may be set to a time longer than the minimum rise time of the pulse of the radio frequency power that can be output from the radio frequency power source 61.

The ions in the plasma in the chamber 10 are accelerated toward the substrate W in the second period P2. As a result, in the second period P2, the substrate W is etched. Therefore, in the second period P2, a reaction product is released from the substrate W. In a case where the electron temperature of the plasma is high, re-dissociation of the reaction product occurs. The substance generated by the re-dissociation of the reaction product may be deposited on the substrate W. In the plasma processing apparatus 1B, since the radio frequency power HF is not supplied in the second period P2, the electron temperature of the plasma is low in the second period P2. Therefore, according to the plasma processing apparatus 1B, the re-dissociation of the reaction product is suppressed. If the re-dissociation of the reaction product is suppressed, the formation of the deposit on the substrate W is suppressed. As a result, a reduction or clogging of an opening formed in the substrate W by plasma etching is suppressed.

Further, in the first period P1, the radio frequency power HF is supplied as one or more pulses PL. The power level of each pulse PL gradually increases to the peak thereof. Therefore, overshoot of the electron temperature is suppressed. As a result, according to the plasma processing apparatus 1B, excessive dissociation of gas is suppressed. Therefore, according to the plasma processing apparatus 1B, it becomes possible to etch the substrate W at a relatively high etching rate.

In an embodiment, the controller 80 or another controller may control the bias power source 81B to set the phase of the radio frequency bias power LF. Specifically, the radio frequency power source 61 and the bias power source 81B are synchronized with each other by a clock signal which is provided from the controller 80 or another controller. The controller 80 or another controller provides a signal for setting the phase of the radio frequency bias power LF to the bias power source 81B to set the phase difference between the radio frequency power HF and the radio frequency bias power LF. The bias power source 81B outputs the radio frequency bias power LF with a given phase. According to this embodiment, it becomes possible to adjust a time difference TA between the point in time of end of the supply of the pulse PL and the point in time when the potential of the lower electrode 18 has a negative peak. Further, it becomes possible to adjust a time difference TB between the point in time when the potential of the lower electrode 18 has a negative peak and the point in time when the supply of the pulse PL is started.

Figure 9:
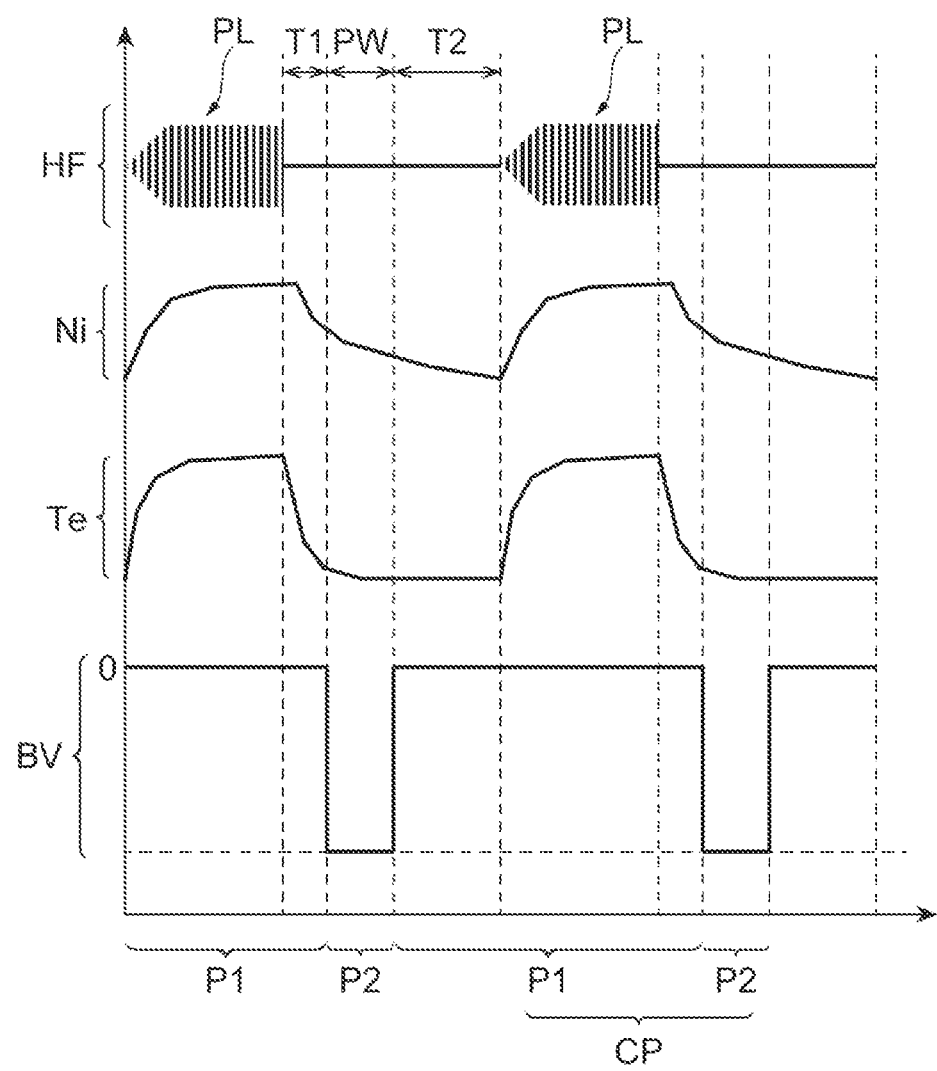
FIG. 9 is still another exemplary timing chart of radio frequency power, ion density, an electron temperature, and bias power.

Hereinafter, FIG. 9 will be referred to. FIG. 9 is still another exemplary timing chart of the radio frequency power (HF), the ion density (Ni), the electron temperature (Te), and the bias power (pulsed negative direct-current voltage BV). As shown in FIG. 9, also in still another embodiment, the radio frequency power source 61 generates the radio frequency power HF such that each pulse PL has a power level that gradually increases from the point in time of start thereof to the point in time when the peak thereof appears. In still another embodiment, the rise time of each pulse PL of the radio frequency power HF may be set to a time longer than the minimum rise time of the pulse of the radio frequency power that can be output from the radio frequency power source 61. In this embodiment, the radio frequency power source 61 may have a ramp-up circuit or a ramp-up function for adjusting a rise time, that is, a ramp rise time, of the rectangular pulse of the radio frequency power. As shown in FIG. 9, in still another embodiment, a fall time of each pulse PL which is generated by the radio frequency power source 61 may be shorter than the rise time of each pulse PL. For example, each pulse may be switched from ON to OFF substantially instantaneously or continuously. Further, in the embodiment shown in FIG. 9, instead of the pulsed negative direct-current voltage BV, the radio frequency bias power LF may be used as the bias power.

Figure 10:
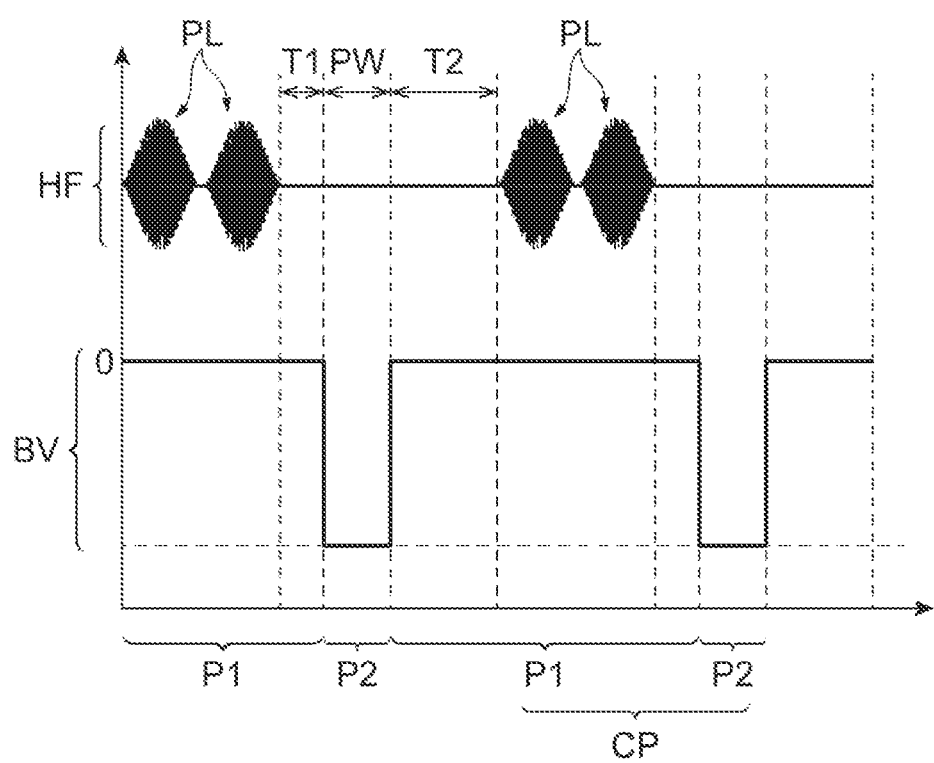
FIG. 10 is still another exemplary timing chart of radio frequency power and bias power.

Hereinafter, FIG. 10 will be referred to. FIG. 10 is still another exemplary timing chart of the radio frequency power (HF) and the bias power (pulsed negative direct-current voltage BV). In still another embodiment, as shown in FIG. 10, the radio frequency power source 61 may generate a plurality of pulses PL for generating a plasma in the first period P1. In the first period P1, the plurality of pulses PL are supplied continuously or intermittently and sequentially. According to this embodiment, the average value of the electron temperature of the plasma in the first period P1 is reduced. Therefore, excessive dissociation of gas in the chamber 10 is further suppressed. In the embodiment shown in FIG. 10, instead of the pulsed negative direct-current voltage BV, the radio frequency bias power LF may be used as the bias power.

Figure 11:
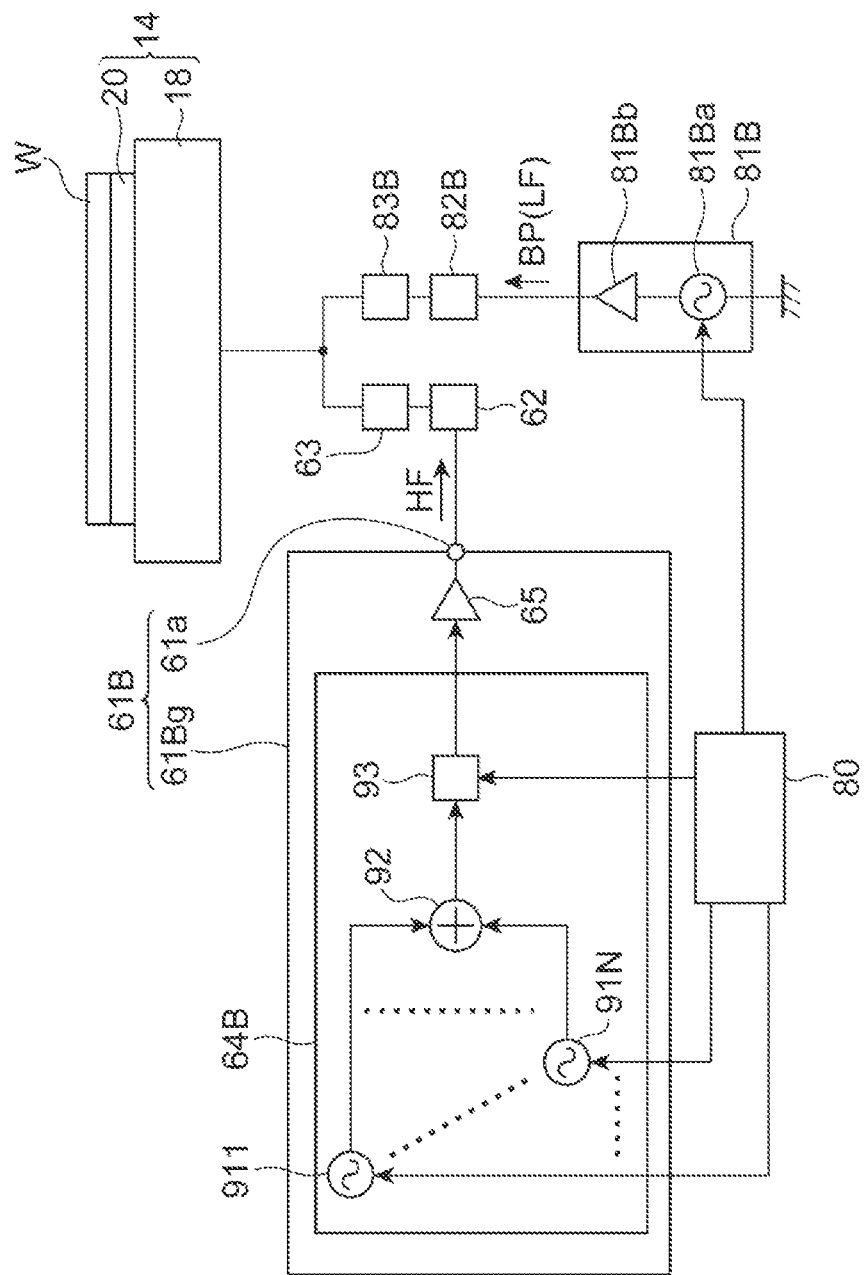
FIG. 11 is a diagram showing a configuration of a radio frequency power source according to another exemplary embodiment.

Hereinafter, FIG. 11 will be referred to. FIG. 11 is a diagram showing the configuration of a radio frequency power source according to another exemplary embodiment. As shown in FIG. 11, in another embodiment, instead of the radio frequency power source 61, a radio frequency power source 61B may be used. The radio frequency power source 61B includes a power generator 61Bg and an output 61a. The power generator 61Bg is configured to generate the radio frequency power HF. In the radio frequency power source 61B, the output 61a is configured to output the radio frequency power HF generated by the power generator 61Bg.

The power generator 61Bg has a modulated signal generator 64B. The power generator 61Bg may further include the amplifier 65. The modulated signal generator 64B generates a modulated radio frequency signal. The radio frequency power HF may be the modulated radio frequency signal which is generated by the modulated signal generator 64B. In this case, the amplifier 65 is not necessary. Alternatively, the radio frequency power HF may be generated by amplifying the modulated radio frequency signal by the amplifier 65.

The modulated signal generator 64B may include a plurality of signal generators 911 to 91N, an adder 92, and a switching circuit 93. Here, "N" is an integer of 2 or more. The plurality of signal generators 911 to 91N are configured to generate a plurality of radio frequency signals, respectively. The respective frequencies of the plurality of radio frequency signals are set symmetrically with respect to the fundamental frequency $f_0$. The respective frequencies of the plurality of radio frequency signals are set at the interval of the predetermined frequency $f_P$.

The adder 92 is configured to add the plurality of radio frequency signals from the plurality of signal generators 911 to 91N to generate a composite signal. The envelope of the composite signal has peaks that periodically appear at the time interval $T_P$. The switching circuit 93 is configured to generate the modulated radio frequency signal from the composite signal. The modulated radio frequency signal is set such that the amplitude level thereof is zero in the period $P_A$ excluding the period $P_P$ between the zero-cross region $Z_A$ of the envelope immediately before the point in time of appearance of each peak of the envelope of the composite signal and the zero-cross region $Z_B$ of the envelope immediately after the point in time of the appearance. The radio frequency power source 61B is also able to generate the radio frequency power HF, similarly to the radio frequency power source 61. That is, the radio frequency power source 61B is also able to generate pulses of the radio frequency power.

While various exemplary embodiments have been described above, various additions, omissions, substitutions and changes may be made without being limited to the exemplary embodiments described above. Elements of the different embodiments may be combined to form another embodiment.

In another embodiment, the plasma processing apparatus may be another type of plasma processing apparatus such as an inductively coupled plasma processing apparatus. In the inductively coupled plasma processing apparatus, the radio frequency power HF is supplied to an antenna for generating an inductively coupled plasma.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a plasma processing chamber;
a lower electrode provided in the plasma processing chamber;
an upper electrode provided above the lower electrode;
a bias power source coupled to the lower electrode and configured to generate a negative direct-current voltage, the bias power source being configured to stop application of the negative direct-current voltage to the lower electrode in a first period and to apply the negative direct-current voltage to the lower electrode in a second period, wherein the first period and the second period are alternatively repeated; and
a radio frequency power source coupled to the upper electrode or the lower electrode and configured to generate one or more pulses of radio frequency power in the first period, wherein
each of the one or more pulses has a start period in which a power level thereof gradually increases from a point in time of start thereof.

2. The plasma processing apparatus according to claim 1, further comprising
a controller configured to control the bias power source to set a phase of a cycle which includes the first period and the second period.

3. The plasma processing apparatus according to claim 2, wherein
the controller is configured to further control the bias power source to set a duration length of the negative direct-current voltage in the cycle.

4. The plasma processing apparatus according to claim 1, wherein
a rise time of each of the one or more pulses is longer than a minimum rise time of a pulse of radio frequency power capable of being output from the radio frequency power source.

5. The plasma processing apparatus according to claim 1, wherein
the radio frequency power source is configured to be capable of adjusting a rise time of each of the one or more pulses.

6. The plasma processing apparatus according to claim 1, wherein the radio frequency power source is configured to sequentially supply a plurality of pulses as the one or more pulses in the first period.

7. The plasma processing apparatus according to claim 1, wherein
the radio frequency power source is coupled to the lower electrode.

8. The plasma processing apparatus according to claim 1, wherein
the radio frequency power has a frequency which is not less than 13 MHz and not more than 200 MHz.

9. The plasma processing apparatus according to claim 1, wherein
the radio frequency power source is configured to stop supply of the radio frequency power in the second period.

10. A plasma processing apparatus comprising:
a plasma processing chamber;
a lower electrode provided in the plasma processing chamber;
an upper electrode provided above the lower electrode;
a bias power source coupled to the lower electrode and configured to generate radio frequency bias power which has a continuous wave form of which a frequency is a first frequency, wherein each cycle defined by the first frequency includes a first period and a second period, a voltage of the radio frequency bias power in the first period is higher than an average voltage of the radio frequency bias power, and a voltage of the radio frequency bias power in the second period is lower than an average voltage of the radio frequency bias power; and
a radio frequency power source coupled to the upper electrode or the lower electrode and configured to generate one or more pulses of radio frequency power in the first period, the radio frequency power having a second frequency which is higher than the first frequency, wherein each of the one or more pulses has a start period in which a power level thereof gradually increases from a point in time of start thereof.

11. The plasma processing apparatus according to claim 10, further comprising
a controller configured to control the bias power source to set a phase of the radio frequency bias power.

12. The plasma processing apparatus according to claim 10, wherein
a rise time of each of the one or more pulses is longer than a minimum rise time of a pulse of radio frequency power capable of being output from the radio frequency power source.

13. The plasma processing apparatus according to claim 10, wherein the radio frequency power source includes
a power generator configured to generate the radio frequency power, and
an output configured to output the radio frequency power generated by the power generator.

14. The plasma processing apparatus according to claim 13, wherein
the power generator is configured to generate the radio frequency power including a plurality of power components respectively having a plurality of frequencies, the plurality of frequencies being set symmetrically with respect to a fundamental frequency at an interval of a predetermined frequency, an envelope of the radio frequency power having peaks that periodically appear at a time interval defined by the predetermined frequency or a frequency that is a multiple of twice or more the predetermined frequency, and a power level of the radio frequency power being set to be zero in a period excluding a period between a zero-cross region of the envelope immediately before a point in time of appearance of each of the peaks and a zero-cross region of the envelope immediately after the point in time of the appearance.

15. The plasma processing apparatus according to claim 13, wherein the power generator includes:
a waveform data generator;
a quantizer configured to quantize waveform data generated by the waveform data generator to generate quantized data;
an inverse Fourier transformer configured to generate I data and Q data by applying inverse Fourier transform to the quantized data; and
a modulator configured to generate a modulated radio frequency signal by modulating two reference radio frequency signals of which phases are different from each other by 90° by using the I data and the Q data, and
the power generator is configured to generate the radio frequency power from the modulated radio frequency signal.

16. The plasma processing apparatus according to claim 10, wherein
the radio frequency power source is configured to be capable of adjusting a rise time of each of the one or more pulses.

17. The plasma processing apparatus according to claim 10, wherein
the radio frequency power source is configured to sequentially supply a plurality of pulses as the one or more pulses in the first period.

18. The plasma processing apparatus according to claim 10, wherein
the radio frequency power source is coupled to the lower electrode.

19. The plasma processing apparatus according to claim 10, wherein
the second frequency is not less than 13 MHz and not more than 200 MHz.

20. The plasma processing apparatus according to claim 10, wherein
the radio frequency power source is configured to stop supply of the radio frequency power in the second period.

* * * * *